(12) United States Patent
Mukai

(10) Patent No.: US 9,589,761 B2
(45) Date of Patent: Mar. 7, 2017

(54) ELECTRON MICROSCOPE AND METHOD OF ADJUSTING SAME

(71) Applicant: JEOL Ltd., Tokyo (JP)

(72) Inventor: Masaki Mukai, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 14/823,222

(22) Filed: Aug. 11, 2015

(65) Prior Publication Data

US 2016/0071683 A1   Mar. 10, 2016

(30) Foreign Application Priority Data

Aug. 11, 2014   (JP) .................................. 2014-163644

(51) Int. Cl.
*H01J 37/26* (2006.01)
*H01J 37/05* (2006.01)

(52) U.S. Cl.
CPC ............ *H01J 37/05* (2013.01); *H01J 37/265* (2013.01); *H01J 2237/057* (2013.01)

(58) Field of Classification Search
CPC .......... H01J 37/05; H01J 37/265; H01J 37/12; H01J 2237/057

USPC ..... 250/396 R, 397, 306, 307, 309, 310, 311
See application file for complete search history.

(56) References Cited

U.S. PATENT DOCUMENTS

2013/0112890 A1* 5/2013 Parker .................... H01J 37/05
                                                          250/396 R

FOREIGN PATENT DOCUMENTS

JP         2011129257 A        6/2011

* cited by examiner

*Primary Examiner* — Nicole Ippolito
(74) *Attorney, Agent, or Firm* — The Webb Law Firm

(57) ABSTRACT

An electron microscope is offered which can adjust an energy-selecting slit in a short time by smoothly moving the slit. The electron microscope (100) includes an electron beam source (10) emitting an electron beam (EB), an energy filter (22) producing a deflecting field in the path of the electron beam (EB) to disperse the beam (EB) according to energy, a slit plate (24) disposed on an energy dispersive plane and provided with at least one energy-selecting slit (25), a current measuring section (50) for measuring the electrical current of the beam (EB) absorbed into the slit plate (24), and an energy filter controller (60) for controlling the intensity of the deflecting field of the energy filter (22) on the basis of results of measurements made by the current measuring section (50).

10 Claims, 6 Drawing Sheets

ELECTRON MICROSCOPE AND METHOD OF ADJUSTING SAME

BACKGROUND OF THE INVENTION

Field of the Invention

The present invention relates to an electron microscope and method of adjusting it.

Description of Related Art

A monochromator is generally composed of an energy filter for dispersing an electron beam and energy-selecting slits. An electron beam impinging on the monochromator is spectrally dispersed by the energy filter and becomes a spectrum corresponding to an energy distribution of the beam on the surface of an energy-selecting slit located on an energy dispersive plane. By using this energy-selecting slit for the spectrum, only a certain energy width of the electron beam corresponding to the slit width of the energy-selecting slit passes through the slit. As a result, the beam is monochromatized.

Since a monochromator is so designed that a part of an electron beam is selected by an energy-selecting slit, it is inevitable that the amount of electrical current of the beam impinging on a sample will decrease. This, in turn, will lead to a decrease in the brightness of the electron beam. As a result, the performance of the electron microscope will be affected greatly. Therefore, it is necessary that the decrease in the amount of electrical current of the beam due to the monochromator be suppressed to a minimum. In order to secure high energy resolution being one type of fundamental performance of the monochromator and to suppress decreases in the brightness of the electron beam, it is necessary to optimize the position of the energy-selecting slit relative to the spectrum of the electron beam such that the amount of electrical current of the beam passing through the energy-selecting slit is maximized.

Conventional positional adjustment of an energy-selecting slit in a monochromator has depended much on the human operator. The operator judges, depending on direct observation, whether the amount of electrical current of the electron beam that has passed through the slit has increased or decreased from the degree of brightness of the beam, and moves the position of the slit to maximize the amount of current of the beam passing through the slit.

On the other hand, one conceivable method of adjusting the position of the energy-selecting slit in a monochromator consists of measuring the beam passing through the slit by a Faraday cup and an ammeter and adjusting the position of the slit. In this case, the beam passing through the slit is fully absorbed by the Faraday cup and thus it is impossible to directly observe the shape of the beam. An adjustment of the monochromator needs both making an adjustment of the energy filter while directly observing the shape of the beam and an adjustment of the position of the energy-selecting slit. Whenever an operational condition of the energy filter is varied, the Faraday cup is inserted and the amount of electrical current of the beam is measured. This operation is cumbersome to perform and imposes further operational burden on the operator. Furthermore, it takes long to adjust the monochromator. Consequently, it cannot be said that the instrument is easy to use.

Accordingly, JP-A-2011-129257, for example, discloses a method of controlling the position of an energy-selecting slit in a monochromator in such a way that the monochromator can be adjusted in a short time by detecting the electrical current flowing through the slit and controlling the position of the slit such that the detected amount of electrical current is minimized.

However, in the technique of JP-A-2011-129257, the position of the energy-selecting slit is adjusted by mechanically moving it. Therefore, when the energy-selecting slit has just started to move, rattling in a reverse direction moves the slit in a direction reverse to the intended direction. In this way, it is difficult to smoothly move the energy-selecting slit. Accordingly, with the technique of JP-A-2011-129257, it may take long to adjust the position of the energy-selecting slit.

SUMMARY OF THE INVENTION

In view of the foregoing problem, the present invention has been made. One object associated with some aspects of the present invention is to provide an electron microscope and electron microscope adjusting method capable of adjusting an energy-selecting slit in a short time by smoothly moving the slit.

(1) An electron microscope associated with the present invention comprises: an electron beam source emitting an electron beam; an energy filter producing a deflecting field in a path of the electron beam to disperse the electron beam according to energy; a slit plate disposed on an energy dispersive plane and provided with at least one energy-selecting slit; a current measuring section for measuring an electrical current of the electron beam absorbed into the slit plate; and an energy filter controller for controlling the intensity of the deflecting field produced by the energy filter on the basis of results of measurements made by the current measuring section.

In this electron microscope, the position of the electron beam relative to the energy-selecting slit taken in the direction of dispersion can be adjusted by deflecting the electron beam. Therefore, the position can be adjusted more smoothly, for example, than where the slit plate is mechanically moved for adjusting purposes. Consequently, in this electron microscope, the energy-selecting slit can be adjusted in a short time.

(2) In one feature of this electron microscope, the energy filter controller may control the intensity of the deflecting field produced by the energy filter so as to minimize the value of electrical current of the electron beam measured by tie current measuring section.

In this electron microscope, the value of electrical current of the electron beam passing through the energy-selecting slit can be maximized.

(3) In one feature of the electron microscope set forth in the paragraph (2) above, the electron beam that has passed through the energy-selecting slit may be made to impinge on a sample.

In this electron microscope, the electron beam can be monochromatized by the energy filter and the energy-selecting slit and made to impinge on a sample. In consequence, this electron microscope can perform electron energy loss spectroscopy (EELS) at improved energy resolution.

(4) In one feature of this electron microscope, there may be further provided an acceleration tube mounted behind the energy-selecting slit. The current measuring section may be an ammeter connected between the slit plate and a point at an accelerating potential.

In this electron microscope, the electrical current of the electron beam absorbed into the slit plate can be measured by the ammeter connected between the slit plate and the point at the accelerating potential.

(5) In one feature of the electron microscope set forth in the paragraph (3) above, there may be further provided an acceleration tube mounted ahead of the energy filter. The current measuring section is an ammeter connected between the slit plate and a point at ground potential.

In this electron microscope, the electrical current of the electron beam absorbed into the slit plate can be measured by the ammeter connected between the slit plate and the point at ground potential.

(6) In another feature of the electron microscope set forth in the paragraph (2) above, the electron beam emitted from the electron beam source is transmitted through a sample and may be monochromatized by the energy filter and the slit plate.

In this electron microscope, the electron beam transmitted through the sample can be monochromatized and imaged by the energy filter and energy-selecting slit. In this electron microscope, therefore, only elastically scattered electrons, for example, can be selected and imaged by the energy filter and the energy-selecting slit. Consequently, a background arising from inelastically scattered electrons can be removed, and a clearer TEM image can be obtained.

(7) A method associated with the present invention is implemented to adjust an electron microscope having an electron beam source, an energy filter for dispersing an electron beam according to energy, and a slit plate disposed on an energy dispersive plane and provided with at least one energy-selecting slit. The method comprises the step of adjusting the intensity of a deflecting field produced by the energy filter on the basis of a value of electrical current of the electron beam absorbed into the slit plate.

In this method of adjusting an electron microscope, the position of the electron beam relative to the energy-selecting slit taken in the direction of dispersion can be adjusted by deflecting the electron beam. Therefore, the position can be adjusted more smoothly, for example, as compared to the case where the slit plate is mechanically moved for adjusting purposes. Consequently, in this method of adjusting an electron microscope, the energy-selecting slit can be adjusted in a short time.

(8) In one feature of this method of adjusting an electron microscope, during the step of adjusting the intensity of the deflecting field produced by the energy filter, the intensity of the deflecting field produced by the energy filter may be adjusted to minimize the value of electrical current of the electron beam absorbed into the slit plate.

In this method of adjusting an electron microscope, the value of electrical current of the electron beam passing through the energy-selecting slit can be maximized.

(9) In another feature of this method of adjusting an electron microscope, the electron beam that has passed through the energy-selecting slit may be made to impinge on a sample.

In this method of adjusting an electron microscope, the electron beam can be monochromatized by the energy filter and the energy-selecting slit and made to impinge on a sample. In consequence, this method permits the electron microscope to perform electron energy loss spectroscopy (EELS) at improved energy resolution.

(10) In one feature of this method of adjusting an electron microscope, the electron beam that has passed through the energy-selecting slit enters an acceleration tube. During the step of adjusting the intensity of the deflecting field produced by the energy filter, the value of electrical current of the electron beam absorbed into the slit plate may be measured by an ammeter connected between the slit plate and a point at an accelerating potential.

In this method of adjusting an electron microscope, the electrical current of the electron beam absorbed into the slit plate can be measured by the ammeter connected between the slit plate and the point at the accelerating potential.

(11) In one feature of this method of adjusting an electron microscope, the electron beam is accelerated by an acceleration tube and enters the energy filter. During the step of adjusting the intensity of the deflecting field produced by the energy filter, the value of electrical current of the electron beam absorbed into the slit plate may be measured by an ammeter connected between the slit plate and a point at ground potential.

In this method of adjusting an electron microscope, the electrical current of the electron beam absorbed into the slit plate can be measured by the ammeter connected between the slit plate and the point at ground potential.

(12) In a further feature of this method of adjusting an electron microscope as set forth in paragraph (7) above, the electron beam emitted from the electron beam source may be transmitted through a sample and monochromatized by both the energy filter and the slit plate.

In this method of adjusting an electron microscope, the electron beam that has passed through a sample can be monochromatized and imaged. Therefore, in this method of adjusting an electron microscope, a background arising from inelastically scattered electrons can be removed by selecting and imaging only the inelastically scattered electrons, for example. Hence, a clearer TEM image can be obtained.

DESCRIPTION OF THE INVENTION

The preferred embodiments of the present invention are hereinafter described in detail with reference to the drawings. It is to be understood that the embodiments provided below do not unduly restrict the scope and content of the present invention delineated by the appended claims and that not all the configurations described below are essential constituent components of the invention.

1. First Embodiment 1.1. Electron Microscope

Figure 1:
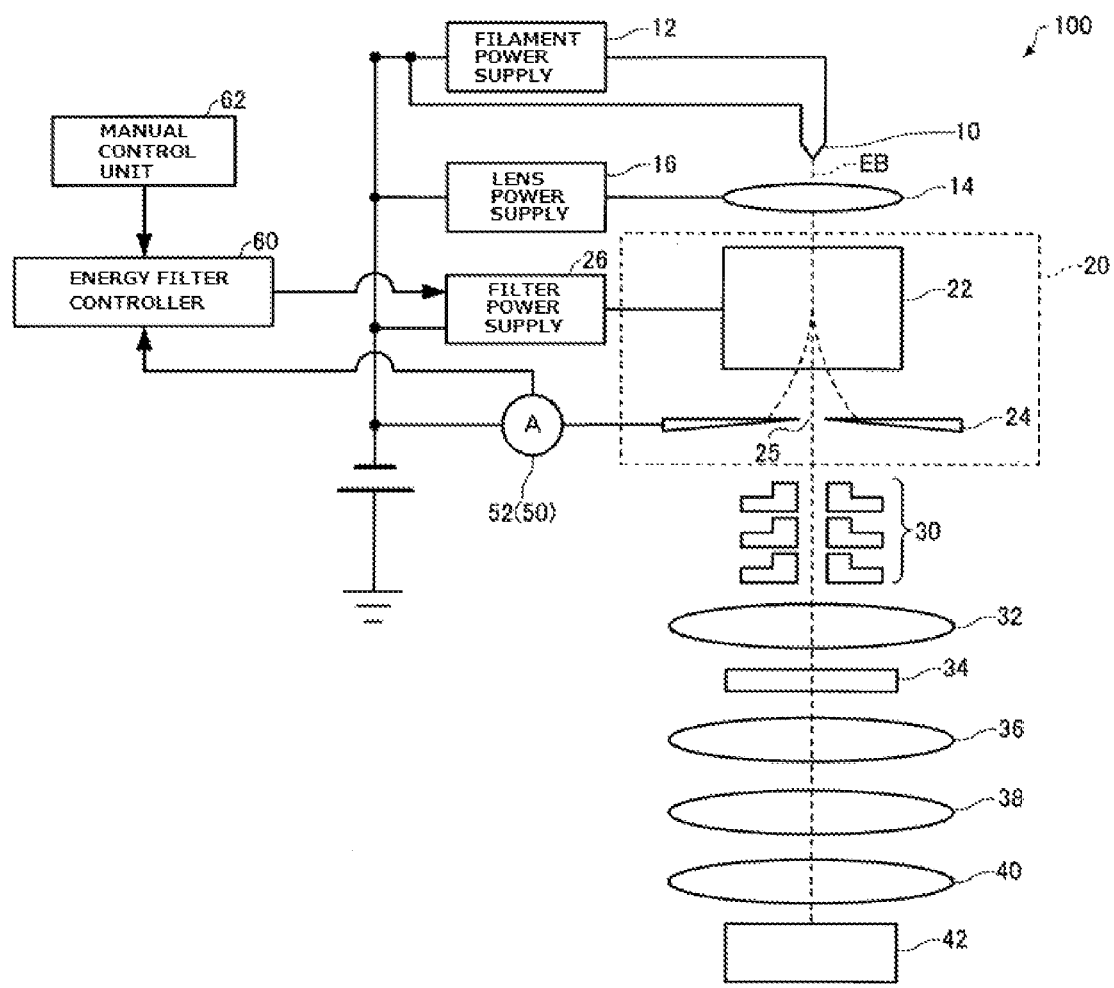
FIG. 1 is a schematic representation, partly in block form, of an electron microscope associated with a first embodiment of the present invention.

An electron microscope associated with a first embodiment of the present invention is first described by referring to FIG. 1, which schematically shows the configuration of this electron microscope, 100, associated with the first embodiment.

The electron microscope 100 is a transmission electron microscope (TEM) that is an instrument for imaging electrons transmitted through a sample to obtain transmission electron microscope (TEM) images including bright field images, dark field images, diffraction patterns, and so on.

As shown in FIG. 1, the electron microscope 100 includes an electron beam source 10, a filament power supply 12, a lens 14, a lens power supply 16, a monochromator 20, an acceleration tube 30, a condenser lens system 32, a sample stage 34 for holding a sample, an objective lens 36, an intermediate lens 38, a projector lens 40, an imager 42, a current measuring section 50, an energy filter controller 60, and a manual control unit 62.

The electron beam source 10 produces an electron beam EB by accelerating electrons, which are emitted from a filament cathode, by an anode. A thermionic-emission electron gun, a field-emission electron gun, or a Schottky electron gun can be used as the electron beam source 10. Electric power for operation is supplied to the filament cathode of the electron beam source 10 from the filament power supply 12.

The lens 14 of the electrostatic type is mounted ahead of (i.e., on the upstream side as viewed along the stream of the electron beam EB) the monochromator 20. The lens 14 adjusts the orbit of the electron beam EB emitted from the electron beam source 10, i.e., adjusts the angle of incidence of the incident electron beam relative to the monochromator 20. The lens power supply 16 supplies the electric power for operating the lens 14.

The monochromator 20 monochromatizes the electron beam EB, selects a given energy width of the electron beam EB. The monochromator 20 has an energy filter 22 and a slit plate 24 provided with at least one energy-selecting slit 25.

The energy filter 22 disperses the incident electron beam EB according to energy. The energy filter 22 produces a deflecting field that is a magnetic field, an electric field, or both magnetic and electric fields in the path of the electron beam EB, spectrally disperses the electron beam EB by making use of difference in orbit depending on the speed of electrons within the deflecting field, and projects a spectrum onto an energy dispersive plane. In the energy filter 22, the position of the electron beam EB on the energy dispersive plane taken in the direction of dispersion can be adjusted by controlling the deflecting field.

The energy filter 22 is made, for example, of a Wien filter that applies an electric field and a magnetic field, which are perpendicular to each other, to the electron beam EB traveling along the optical axis. No restriction is placed on the type of the energy filter 22 as long as the electron beam EB can be dispersed according to energy. For example, an omega filter may be used as the energy filter 22. Electric power for operation is supplied to the energy filter 22 from a filter power supply 26.

The slit plate 24 is disposed on the energy dispersive plane and provided with the energy-selecting slit 25. A desired energy width of the electron beam EB can be extracted using the energy-selecting slit 25.

Figure 2:
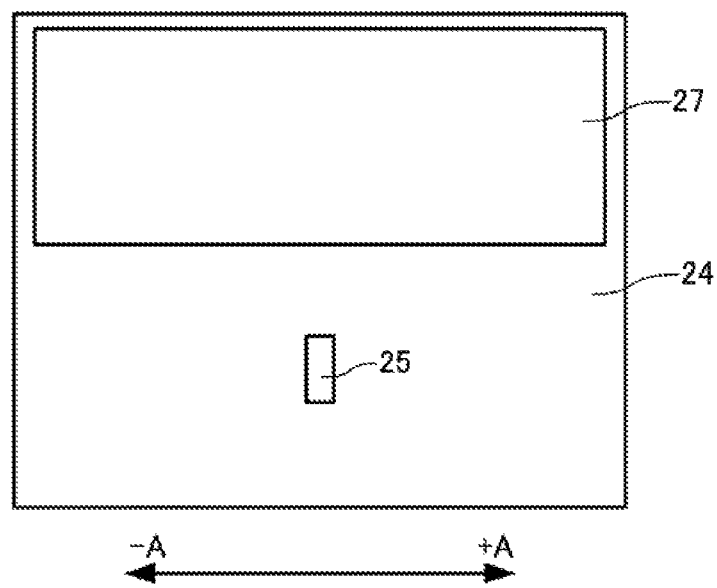
FIG. 2 is a schematic plan view of the slit plate of the electron microscope shown in FIG. 1.

FIG. 2 is a schematic plan view of the slit plate 24. For example, the slit plate 24 is made of a metal plate. As shown in FIG. 2, the energy-selecting slit 25 is formed in the slit plate 24. The energy-selecting slit 25 has a given width (termed a slit width) taken in the direction (A direction (+A direction or −A direction)) in which the electron beam EB is dispersed in energy. The energy-selecting slit 25 is rectangular in planar shape, for example. The slit width of the energy-selecting slit 25 is hundreds of nanometers to tens of microns, for example.

The at least one energy-selecting slit 25 formed in the slit plate 24 may be plural in number and have different slit widths. Furthermore, the slit plate 24 has an open hole 27 to permit the whole incident electron beam EB to pass through. The slit plate 24 may be designed to be capable of moving via a moving mechanism (not shown) in the A direction where energy dispersion occurs or in a direction perpendicular to the A direction (direction of energy dispersion).

The acceleration tube 30 is mounted behind (i.e., on the downstream side as viewed along the stream of the electron beam EB) the monochromator 20. The acceleration tube 30 is composed of a plurality of stages of acceleration electrodes capable of accelerating the electron beam EB successively up to a desired voltage. The electron beam EB that has passed through the energy-selecting slit 25 and thus has been monochromatized by the monochromator 20 enters the acceleration tube 30.

The condenser lens system 32 focuses the electron beam EB, which has been monochromatized by the monochromator 20, onto the sample held on the sample stage 34. The condenser lens system 32 is made up, for example, of a plurality of condenser lenses. In the electron microscope 100, the condenser lens system 32 constitutes an illumination lens system for illuminating the sample with the electron beam EB.

The objective lens 36 is an initial stage of lens for imaging the electron beam EB transmitted through the sample. The objective lens 36 has an upper polepiece and a lower polepiece (none of which are shown). The objective lens 36 produces a magnetic field between the upper and lower polepieces to focus the electron beam EB. The sample held on the sample stage 34 is positioned between the upper and lower polepieces of the objective lens 36.

The intermediate lens 38 is located behind the objective lens 36, The projector lens 40 is positioned behind the intermediate lens 38. The intermediate lens 38 and projector lens 40 cooperate to further magnify the image focused by the objective lens 36 and to focus the image onto the imager 42. In the electron microscope 100, an imaging lens system is constituted by the objective lens 36, intermediate lens 38, and projector lens 40.

The imager 42 captures a TEM image focused by the imaging lens system including the lenses 36, 38, and 40. The imager 42 is a digital camera such as a CCD camera.

The current measuring section 50 measures the value of electrical current of the electron beam EB absorbed into the slit plate 24. The current measuring section 50 is an ammeter 52 connected between the slit plate 24 and a point at an accelerating potential that is used to accelerate electrons made to impinge on the sample after being emitted from the electron beam source 10. The ammeter 52 can measure the electrical current of the electron beam EB which is absorbed into the slit plate 24 without passing through the energy-selecting slit 25. The energy filter controller 60 is informed of the results of measurements made by the ammeter 52.

The energy filter controller 60 controls the intensity of the deflecting field produced by the energy filter 22 on the basis of the result of the measurement made by the current measuring section 50 (ammeter 52). In particular, the energy filter controller 60 controls the intensity of the deflecting field of the energy filter 22 to minimize the value of the electrical current of the beam EB measured by the current measuring section 50 (ammeter 52). As a result, the amount of electrical current of the electron beam EB passing through the energy-selecting slit 25 is maximized. That is, the intensity center of the spectrum of the electron beam EB can be brought into coincidence with the widthwise center of the energy-selecting slit 25. The functions of the energy filter controller 60 can be implemented by hardware such as various processors (e.g., a CPU or a DSP) or by software.

The manual control unit 62 permits a human operator to enter manual control information, and outputs the entered manual control information to the energy filter controller 60. For example, the manual control unit 62 is made of buttons, keys, a touch panel display, a microphone, or the like.

1.2. Method of Adjusting Electron Microscope

Figure 3:
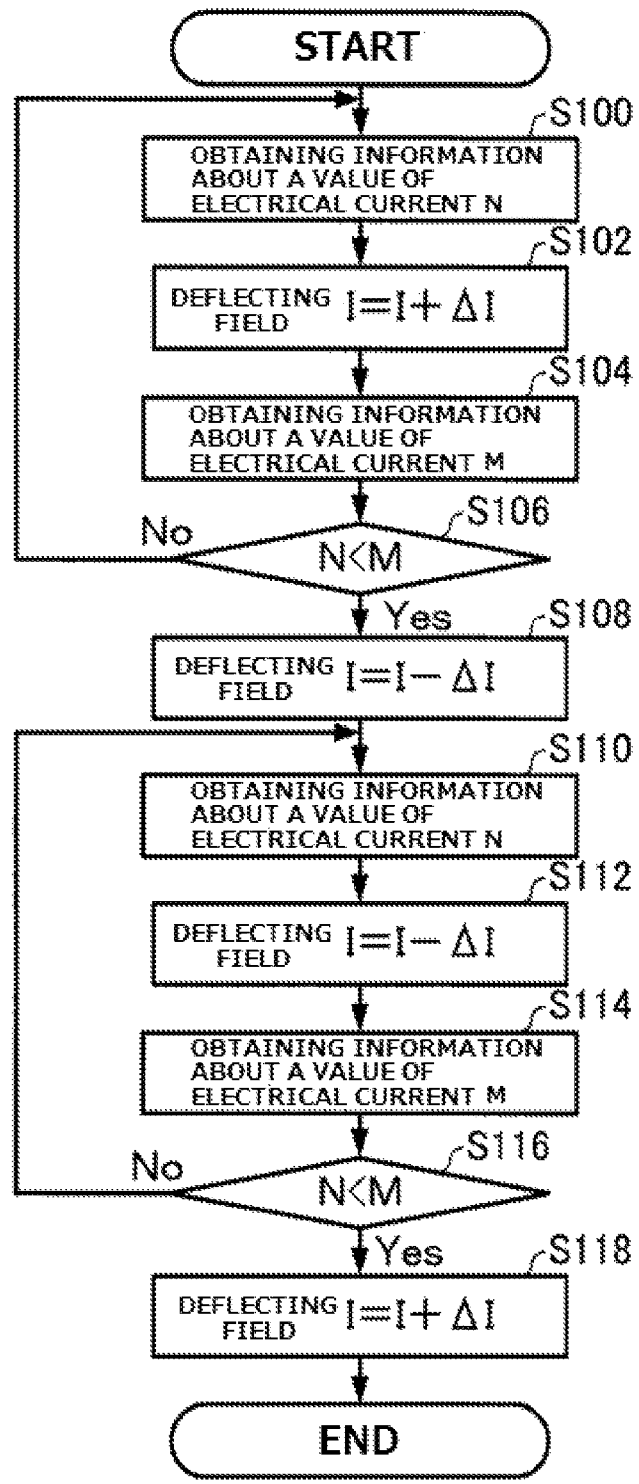
FIG. 3 is a flowchart illustrating one example of method of adjusting the electron microscope shown in FIG. 1.

A method of adjusting the electron microscope 100 associated with the first embodiment is next described by referring to the flowchart of FIG. 3. In this method, the electrical current of the electron beam EB absorbed into the slit plate 24 is measured by the current measuring section 50. The intensity of the deflecting field of the energy filter 22 is adjusted on the basis of the value of the electrical current of the beam EB measured by the energy filter controller 60, thus adjusting the position of the beam EB relative to the energy-selecting slit 25 taken in the direction (A direction) in which the beam EB is dispersed.

When an operator enters a start signal to the energy filter controller 60 via the manual control unit 62 to start an adjustment of the monochromator 20, the energy filter controller 60 starts the adjustment of the energy-selecting slit 25 of the monochromator 20.

First, the energy filter controller 60 obtains information about a value of electrical current N of the electron beam EB absorbed into the slit plate 24, the value being measured by the current measuring section 50 (step S100).

The energy filter controller 60 then increases the output I of the filter power supply 26, which controls the deflecting field of the energy filter 22, by an incremental amount of ΔI to vary the intensity of the deflecting field incrementally, thus moving the position of the beam EB on the slit plate 24 in the +A direction by an incremental distance of Δa (step S102).

After the position of the electron beam EB is moved at step S102, the energy filter controller 60 obtains information about the value of electrical current M of the electron beam EB absorbed into the slit plate 24, the value being measured by the current measuring section 50 (step S104).

The energy filter controller 60 then makes a decision as to whether the value of electrical current N is smaller than the value of electrical current M (N<M) (step S106).

If the decision at step S106 is No, indicating that the relation, N<M, is not satisfied, the energy filter controller 60 again performs the steps S100, S102, S104, and S106. The energy filter controller 60 repeats the processing sequence of the steps S100, S102, S104, and S106 until the relation, N<M, is satisfied.

If the decision at step S106 is Yes, indicating that the relation, N<M, is satisfied, the energy filter controller 60 reduces the output I of the filter power supply 26 by the incremental amount ΔI to vary the intensity of the deflecting field decrementally, thus moving the position of the electron beam EB on the slit plate 24 by the incremental distance Δa in the −A direction (step S108).

The energy filter controller 60 then obtains information about the value of electrical current N of the electron beam EB absorbed into the slit plate 24, the value being measured by the current measuring section 50 after the incremental movement of the beam EB at step S108 (step S110).

The energy filter controller 60 then reduces the output I of the filter power supply 26 by the incremental amount ΔI to vary the intensity of the deflecting field decrementally, thus moving the position of the beam EB on the slit plate 24 by the incremental distance Δa in the −A direction (step S112).

The energy filter controller 60 then obtains information about the value of electrical current M of the electron beam EB absorbed into the slit plate 24, the value being measured by the current measuring section 50 after the incremental movement of the position of the beam EB at step S112 (step S114).

The energy filter controller 60 then makes a decision as to whether the value of electrical current N is smaller than the value of electrical current M (N<M) (step S116).

If the decision at step S116 is No, signifying that the relation, N<M, is not satisfied, the energy filter controller 60 again performs the steps S110, S112, S114, and S116. The energy filter controller 60 repeats the processing sequence of the steps S110, S112, S114, and S116 until the relation, N<M, is satisfied.

If the decision at step S116 is Yes, indicating that the relation, N<M, is satisfied, the energy filter controller 60 increases the output I of the filter power supply 26 by the incremental amount ΔI to vary the intensity of the deflecting field incrementally, thus moving the position of the beam EB on the slit plate 24 by the incremental distance Δa in the +A direction (step S118). Consequently, the energy-selecting slit 25 can be placed into a position where the value of electrical current measured by the current measuring section 50 is minimal. After step S118, the energy filter controller 60 ends the present processing subroutine. Because of the processing subroutine described so far, the position of the electron beam EB relative to the energy-selecting slit 25 taken in the direction of dispersion (A direction) can be adjusted.

The electron microscope 100 has the following features. In the microscope 100, the current measuring section 50 measures the electrical current of the electron beam EB absorbed into the slit plate 24. The energy filter controller 60 controls the intensity of the deflecting field of the energy filter 22 on the basis of the result of the measurement made by the current measuring section 50. Since the position of the electron beam EB relative to the energy-selecting slit 25 taken in the direction of dispersion can be adjusted in the electron microscope 100 by deflecting the beam EB, the position can be adjusted more smoothly, for example, as compared to the case where the slit plate 24 is moved mechanically for adjusting purposes. Consequently, in the microscope 100, an adjustment of the energy-selecting slit 25 of the monochromator 20 can be done in a short time.

Furthermore, in the electron microscope 100, the position of the electron beam EB relative to the energy-selecting slit 25 taken in the direction of dispersion can be adjusted by the energy filter controller 60. Therefore, in the microscope 100, adjustment of the position of the beam EB relative to the energy-selecting slit 25 taken in the direction of dispersion can be automated.

Furthermore, in the electron microscope 100, the electrical current of the electron beam EB that has passed through the energy-selecting slit 25 can be measured indirectly by measuring the electrical current of the beam EB absorbed into the slit plate 24. Therefore, in the microscope 100, the electrical current of the electron beam EB that has passed through the energy-selecting slit 25 can be measured more precisely, for example, as compared to the case where a Faraday cup is disposed behind the projector lens 40 and the electrical current of the beam EB is measured directly.

If the electrical current is measured under conditions where a Faraday cup is disposed behind the projector lens 40, the electron beam EB will be cut off by an optical system including lenses and apertures in going from the energy-selecting slit 25 to the Faraday cup. This may make it impossible to accurately measure the electrical current that has passed through the slit 25. On the other hand, in a case where the electrical current of the electron beam EB passing through the energy-selecting slit 25 is indirectly measured from the value of electrical current of the beam EB absorbed into the slit plate 24, such a problem does not occur. As a result, the electrical current of the electron beam EB that has passed through the energy-selecting slit 25 can be measured more precisely.

Furthermore, in the electron microscope 100, the position of the electron beam EB relative to the energy-selecting slit 25 taken in the direction of dispersion is adjusted by measuring the electrical current of the beam EB absorbed into the slit plate 24 and so an adjustment of the position of the electron beam EB relative to the slit 25 taken in the direction of dispersion and direct observation of the beam can be carried out at the same time.

For example, where the electrical current of the electron beam EB that has passed through the energy-selecting slit 25 is measured using a Faraday cup, the beam is cut off by the Faraday cup. Therefore, no direct observation of the beam can be made. Consequently, it is impossible to carry out an adjustment of the position of the beam EB relative to the slit 25 taken in the direction of dispersion and direct observation of the beam at the same time. In contrast, in the electron microscope 100, the current of the electron beam EB absorbed into the slit plate 24 is measured and, therefore, an adjustment of the position of the beam EB relative to the energy-selecting slit 25 taken in the direction of dispersion and direct observation of the beam can be performed at the same time.

Additionally, in the electron microscope 100, the electrical current of the electron beam EB absorbed into the slit plate 24 can be measured and, therefore, if the operator loses sight of the electron beam EB while manipulating the monochromator 20, it is possible to judge from the result of a measurement made by the current measuring section 50 whether the beam EB is cut off by the slit plate 24 or by other member of the microscope 100. Consequently, the operator can easily find the electron beam EB after missing it.

In the electron microscope 100, the energy filter controller 60 controls the intensity of the deflecting field of the energy filter 22 so as to minimize the electrical current of the electron beam EB measured by the current measuring section 50. Consequently, in the microscope 100, the value of electrical current of the beam EB passing through the energy-selecting slit 25 can be maximized.

In the electron microscope 100, the electron beam EB passing through the energy-selecting slit 25 can be made to impinge on a sample. Therefore, in the microscope 100, the electron beam EB can be monochromatized by the energy filter 22 and energy-selecting slit 25 and made to impinge on a sample. Accordingly, the electron microscope 100 can perform electron energy loss spectroscopy (EELS) at improved energy resolution.

In the electron microscope 100, the acceleration tube 30 is mounted behind the energy-selecting slit 25, and the current measuring section 50 is the ammeter 52 connected between the slit plate 24 and a point at an accelerating potential. Consequently, in the microscope 100, the electrical current of the beam EB absorbed into the slit plate 24 can be measured by the ammeter 52.

A method of adjusting the electron microscope 100 includes the step of adjusting the intensity of the deflecting field of the energy filter 22 on the basis of the value of electrical current of the electron beam EB absorbed into the slit plate 24. Therefore, in this method of adjusting the electron microscope 100, the position of the beam EB relative to the energy-selecting slit 25 taken in the direction of dispersion can be adjusted by deflecting the beam EB and so the position can be adjusted more smoothly, for example, as compared to the case where the slit plate 24 is moved mechanically for adjusting purposes. Consequently, in the method of adjusting the electron microscope 100, the energy-selecting slit 25 can be adjusted in a short time.

In the method of adjusting the electron microscope 100, during the step of adjusting the intensity of the deflecting field of the energy filter 22, the intensity of the deflecting field is adjusted to minimize the value of electrical current of the electron beam EB absorbed into the slit plate 24. Consequently, the value of electrical current of the beam EB passing through the energy-selecting slit 25 can be increased to a maximum.

In the method of adjusting the electron microscope 100, during the step of adjusting the intensity of the deflecting field of the energy filter 22, the value of electrical current of the electron beam EB absorbed into the slit plate 24 is measured by the ammeter 52 connected between the slit plate 24 and a point at an accelerating potential. As a consequence, the electrical current of the electron beam EB absorbed into the slit plate 24 can be measured.

2. Second Embodiment 2.1. Electron Microscope

Figure 4:
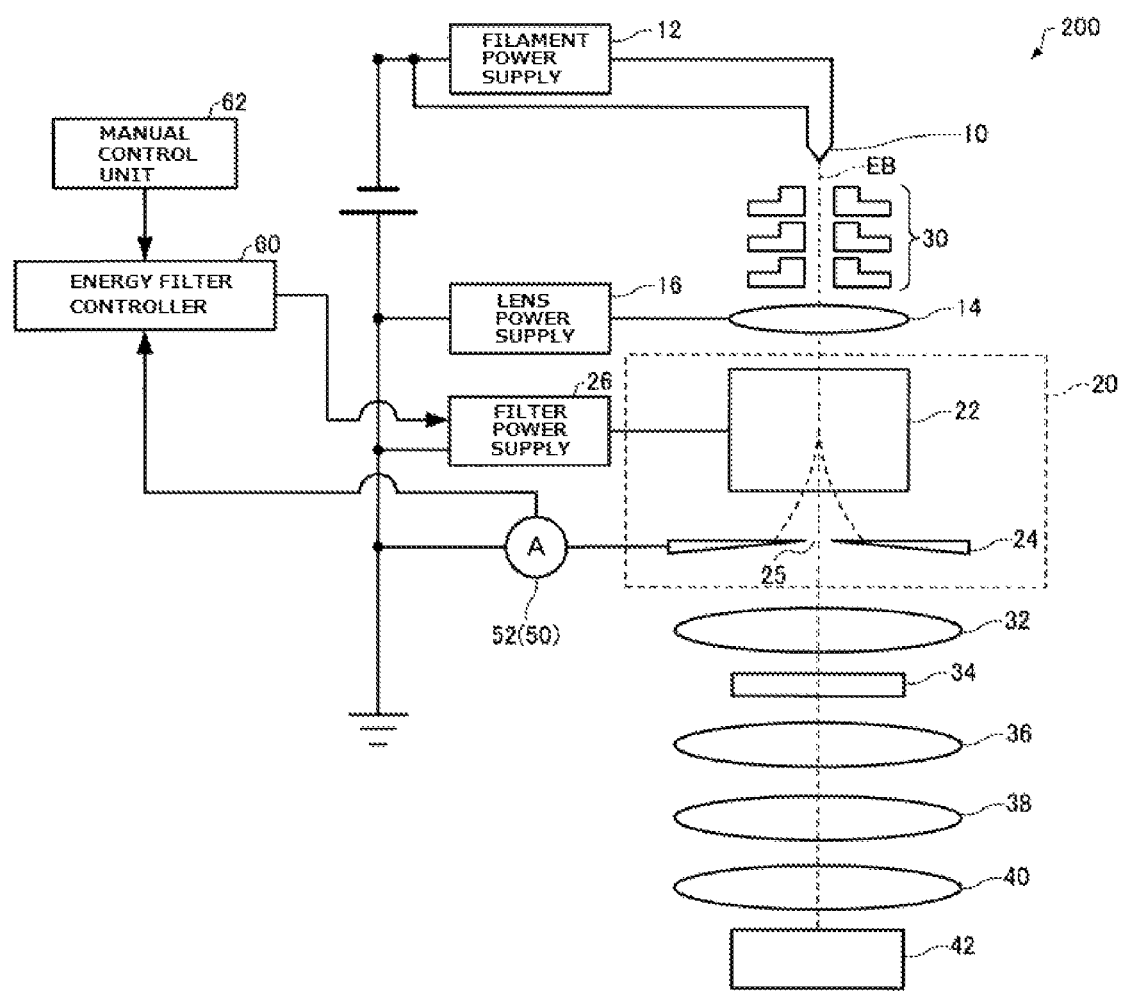
FIG. 4 is a schematic representation similar to FIG. 1, but showing an electron microscope associated with a second embodiment of the invention.

An electron microscope associated with a second embodiment of the present invention is next described by referring to FIG. 4, which schematically shows the configuration of this electron microscope, 200. Those members of the electron microscope 200 associated with the second embodiment which are similar in function to their respective counterparts of the above-described electron microscope 100 associated with the first embodiment are hereinafter indicated by the same reference numerals as in the above referenced FIG. 1 and a detailed description thereof is omitted.

In the above-described electron microscope 100, as shown in FIG. 1, the acceleration tube 30 is disposed behind the monochromator 20 and the current measuring section 50 is the ammeter 52 connected between the slit plate 24 and a point at an accelerating potential.

On the other hand, in the electron microscope 200, as shown in FIG. 4, the acceleration tube 30 is disposed ahead of the monochromator 20, and the current measuring section 50 is an ammeter 52 co The acceleration tube 30 is disposed between the electron beam source 10 and the lens 14, and operates to accelerate the electron beam EB emitted from the electron beam source 10. The beam EB accelerated by the acceleration tube 30 enters the energy filter 22 of the monochromator 20 via the lens 14.

The current measuring section 50 is the ammeter 52 connected between the slit plate 24 and the point at ground potential. In the electron microscope 200, the electrical current of the electron beam EB absorbed into the slit plate 24 can be measured by the ammeter 52.

2.2. Method of Adjusting Electron Microscope

A method of adjusting the electron microscope 200 associated with the second embodiment is similar to the above-described method of adjusting the electron microscope 100 associated with the first embodiment and so a description thereof is omitted.

The electron microscope 200 has the following features. In the microscope 200, the acceleration tube 30 is disposed ahead of the monochromator 20. The current measuring section 50 is the ammeter 52 connected between the slit plate 24 and a point at ground potential. Consequently, in the electron microscope 200, the electrical current of the electron beam EB absorbed into the slit plate 24 can be measured by the ammeter 52.

In the method of adjusting the electron microscope 200, during the step of adjusting the intensity of the deflecting field of the energy filter 22, the value of electrical current of the electron beam EB absorbed into the slit plate 24 is measured by the ammeter 52 connected between the slit plate 24 and a point at ground potential. Consequently, the electrical current of the beam EB absorbed into the slit plate 24 can be measured.

3. Third Embodiment 3.1. Electron Microscope

Figure 5:
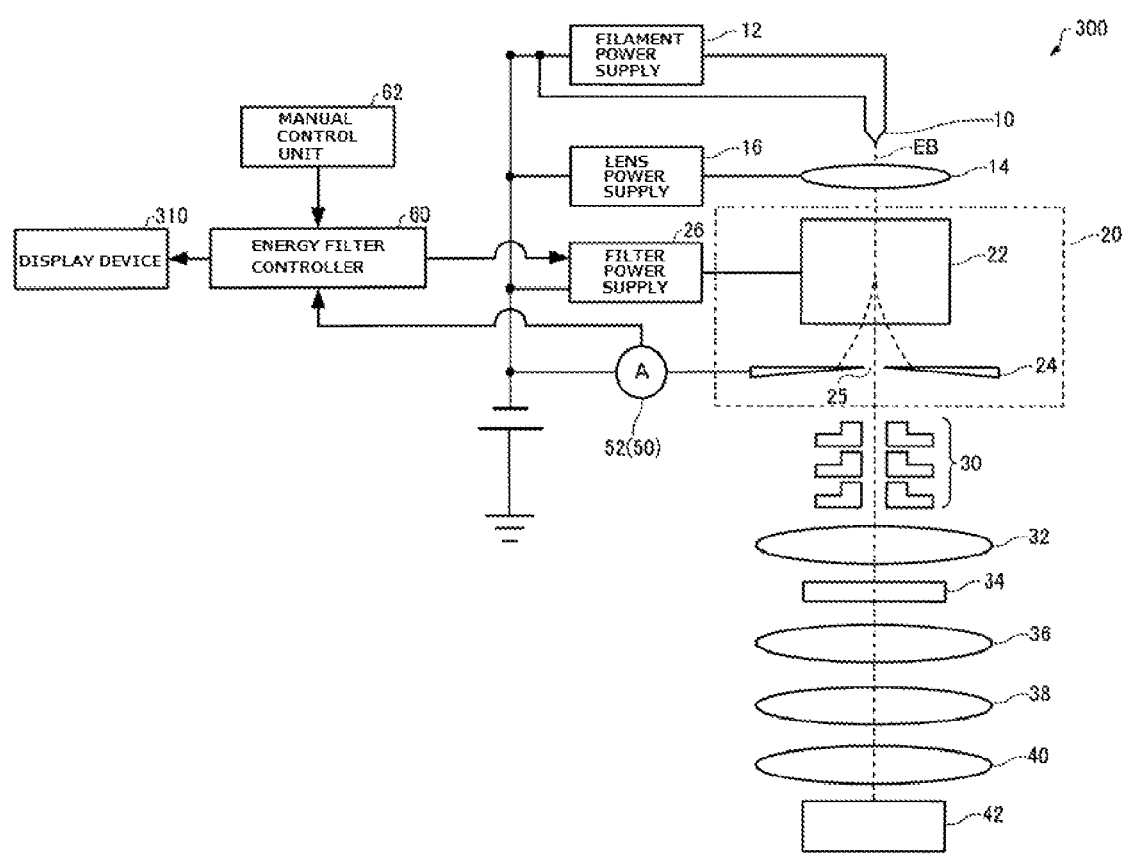
FIG. 5 is a schematic representation similar to FIG. 1, but showing an electron microscope associated with a third embodiment of the invention.

An electron microscope associated with a third embodiment of the present invention is next described by referring to FIG. 5, which schematically shows the configuration of the electron microscope, 300, associated with the third embodiment. Those members of the electron microscope 300 associated with the third embodiment which are similar in function to their respective counterparts of the above-described electron microscope 100 associated with the first embodiment are hereinafter indicated by the same reference numerals as in FIG. 1 and a description thereof is omitted.

As shown in FIG. 5, the electron microscope 300 is configured including a display device 310. This display device 310 provides a display of the results of measurements made by the current measuring section 50, i.e., the value of electrical current of the electron beam EB absorbed into the slit plate 24. The function of the display device 310 can be implemented by an LCD, a CRT, or the like. The value of electrical current of the beam EB absorbed into the slit plate 24 is displayed on the display device 310 in real time. The output signal from the current measuring section 50 which indicates the result of the measurement is sent to the display device 310 via the energy filter controller 60.

3.2. Method of Adjusting Electron Microscope

A method of adjusting the electron microscope 300 associated with the third embodiment is next described. In particular, a case is described wherein a human operator of the electron microscope 300 shown in FIG. 5 manipulates the manual control unit 62 while watching the value of electrical current of the electron beam EB absorbed into the slit plate 24 and displayed on the display device 310 to adjust the intensity of the deflecting field produced by the energy filter 22, thus adjusting the energy-selecting slit 25 of the monochromator 20.

The operator operates the energy filter controller 60 via the manual control unit 62 to minimize the value of electrical current of the electron beam EB absorbed into the slit plate 24 and displayed on the display device 310 while watching the displayed value, thus adjusting the intensity of the deflecting field of the energy filter 22. If the value of electrical current displayed on the display device 310 minimizes, the operator ends the adjustment of the monochromator 20.

In this method of adjusting the electron microscope 300, the position of the electron beam EB relative to the energy-selecting slit 25 taken in the direction of dispersion can be adjusted by deflecting the beam EB and, therefore, the position can be adjusted more smoothly, for example, as compared to the case where the slit plate 24 is moved mechanically for adjusting purposes. Consequently, in this method of adjusting the electron microscope 300, the energy-selecting slit 25 of the monochromator 20 can be adjusted in a short time.

In this example of method of adjusting the electron microscope 300, the acceleration tube 30 is disposed behind the monochromator 20 and the current measuring section 50 is the ammeter 52 connected between the slit plate 24 and a point at an accelerating potential in the same way as in the above-described electron microscope 100. The present invention is similarly applicable to a case in which the acceleration tube 30 is disposed ahead of the monochromator 20 and the current measuring section 50 is the ammeter 52 connected between the slit plate 24 and a point at ground potential in the same way as in the electron microscope 200.

4. Fourth Embodiment 4.1. Electron Microscope

Figure 6:
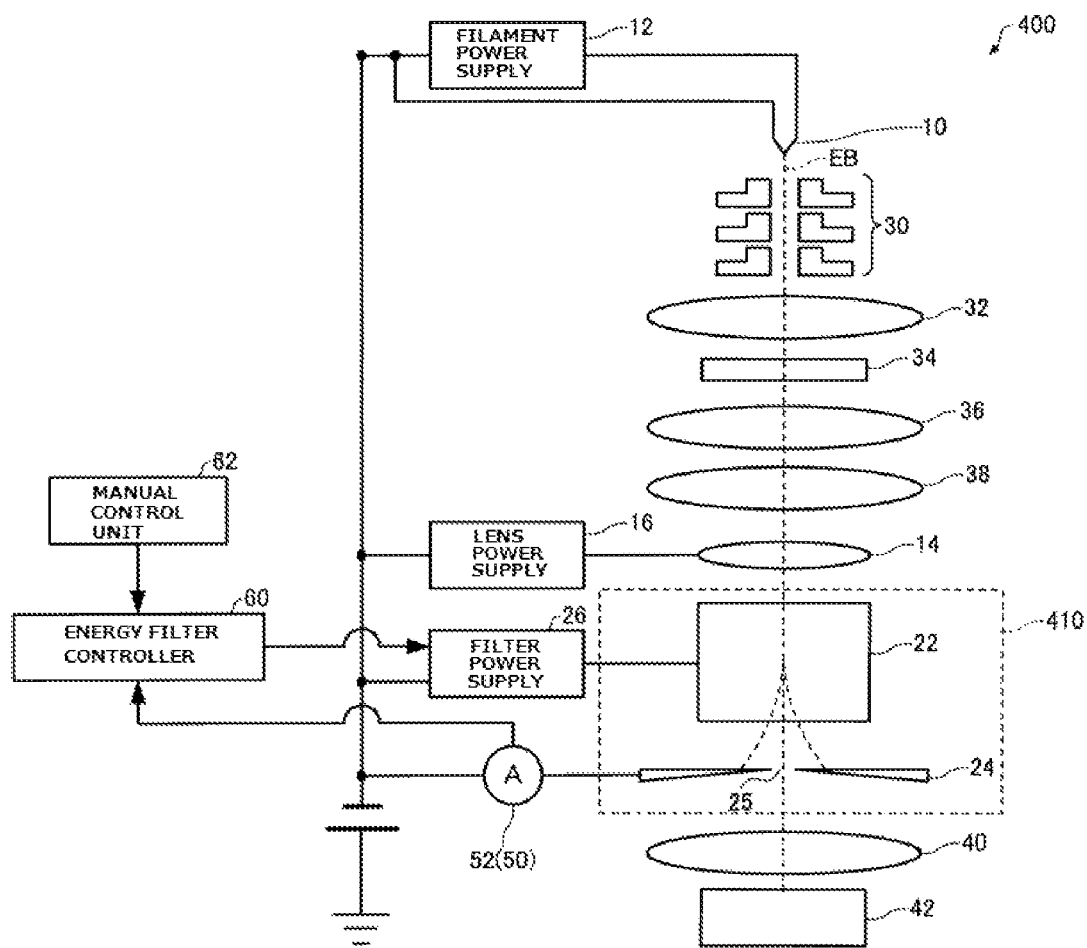
FIG. 6 is a schematic representation similar to FIG. 1, but showing an electron microscope associated with a fourth embodiment of the invention.

An electron microscope associated with a fourth embodiment of the present invention is next described by referring to FIG. 6, which schematically shows the configuration of the electron microscope, 400, associated with the fourth embodiment. Those members of the electron microscope 400 associated with the fourth embodiment which are similar in function to their respective counterparts of the above-described electron microscope 100 associated with the fourth embodiment are hereinafter indicated by the same reference numerals as in FIG. 1 and a detailed description thereof is omitted.

In the above-described electron microscope 100, the electron microscope EB that has passed through the energy-selecting slit 25 is made to impinge on a sample as shown in FIG. 1. In particular, in the microscope 100, the beam EB emitted from the electron beam source 10 is monochromatized by the energy filter 22 and energy-selecting slit 25 and made to impinge on a sample. That is, in the microscope 100, the energy filter 22 and the energy-selecting slit 25 together constitute the monochromator 20.

In contrast, in the electron microscope 400, the electron beam EB emitted from the electron beam source 10 and transmitted through a sample is monochromatized by the energy filter 22 and energy-selecting slit 25 as shown in FIG. 6. That is, in the microscope 400, the energy filter 22 and energy-selecting slit 25 together constitute an energy analyzer 410.

The energy analyzer 410 is mounted between the intermediate lens 38 and the projector lens 40. In the electron microscope 400 equipped with the energy analyzer 410, when an EELS analysis is performed, imaging of electrons having a certain range of energies out of energy analyzed electrons is possible as well as acquisition of an EELS spectrum.

In the electron microscope 400, the electron beam EB emitted from the electron beam source 10 is made to impinge on a sample by the condenser lens system 32. The beam EB transmitted through the sample enters the energy analyzer 410, is dispersed in energy by the energy filter 22, subjected to energy selection by the energy-selecting slit 25, and then focused onto the imager 42 by the projector lens 40. As a result, in the electron microscope 400, a TEM image can be obtained from a focused, selected energy width of the electron beam EB.

4.2. Method of Adjusting Electron Microscope

A method of adjusting the electron microscope 400 associated with the fourth embodiment of the present invention is similar to the above-described method of adjusting the electron microscope 100 associated with the first embodiment and so a description of that method is omitted.

In the electron microscope 400, the electron beam EB emitted from the electron beam source 10 and transmitted through a sample is monochromatized by the energy filter 22 and the slit plate 24. Therefore, in the microscope 400, the beam EB transmitted through the sample can be monochromatized and imaged. Consequently, in the microscope 400, only elastically scattered electrons, for example, are selected and imaged by the energy filter 22 and energy-selecting slit 25 and thus a background arising from inelastically scattered electrons can be removed. Hence, a clearer TEM image can be obtained.

Furthermore, in the electron microscope 400, the energy filter controller 60 controls the intensity of the deflecting field produced by the energy filter 22 to minimize the electrical current of the electron beam EB measured by the current measuring section 50. Therefore, in the microscope 400, the value of electrical current of the beam EB passing through; the energy-selecting slit 25 can be increased to a maximum. Consequently, the electron microscope 400 can produce a TEM image having a large amount of signal, e.g., having high contrast.

In addition, the electron microscope 400 can yield advantageous effects similar to those produced by the above-described electron microscope 100. Further, the method of adjusting the electron microscope 400 can yield advantageous effects similar to those produced by the above-described method of adjusting the electron microscope 100.

Additionally, the above-described method of adjusting the electron microscope 300 associated with the third embodiment is similarly applicable to the method of adjusting the electron microscope 400 associated with the fourth embodiment.

It is to be noted that the above-described embodiments are merely exemplary and that the present invention is not restricted thereto. For example, the embodiments may be combined appropriately.

The present invention embraces configurations (e.g., configurations identical in function, method, and results or identical in purpose and advantageous effects) which are substantially identical to the configurations described in any one of the above embodiments. Furthermore, the invention embraces configurations which are similar to the configurations described in any one of the above embodiments except that their nonessential portions have been replaced. Additionally, the invention embraces configurations which are identical in advantageous effects to, or which can achieve the same object as, the configurations described in any one of the above embodiments. Further, the invention embraces configurations which are similar to the configurations described in any one of the above embodiments except that a well-known technique is added.

Having thus described my invention with the detail and particularity required by the Patent Laws, what is desired protected by Letters Patent is set forth in the following claims.

The invention claimed is:

1. An electron microscope comprising:
an electron beam source emitting an electron beam;
an energy filter producing a deflecting field in a path of the electron beam to disperse the electron beam according to energy;
a slit plate disposed on an energy dispersive plane and provided with at least one energy-selecting slit;
a current measuring section for measuring an electrical current of the electron beam absorbed into the slit plate; and
an energy filter controller for controlling the intensity of the deflecting field produced by the energy filter on the basis of results of measurements made by the current measuring section, wherein said energy filter controller controls the intensity of said deflecting field so as to minimize the value of electrical current of said electron beam measured by said current measuring section.

2. The electron microscope as set forth in claim 1, wherein said electron beam that has passed through said energy-selecting slit is made to impinge on a sample.

3. The electron microscope as set forth in claim 2, further comprising an acceleration tube mounted behind said energy-selecting slit, and wherein said current measuring section is an ammeter connected between said slit plate and a point at an accelerating potential.

4. The electron microscope as set forth in claim 2, further comprising an acceleration tube mounted ahead of said energy filter, and wherein said current measuring section is an ammeter connected between said slit plate and a point at ground potential.

5. The electron microscope as set forth in claim 1, wherein said electron beam emitted from said electron beam source is transmitted through a sample and monochromatized by said energy filter and said slit plate.

6. A method of adjusting an electron microscope having an electron beam source, an energy filter for dispersing the electron beam according to energy, and a slit plate disposed on an energy dispersive plane and provided with at least one energy-selecting slit, said method comprising the step of:
adjusting the intensity of a deflecting field produced by said energy filter on the basis of a value of electrical current of said electron beam absorbed into said slit plate,
wherein during said step of adjusting the intensity of the deflecting field produced by said energy filter, the intensity of the deflecting field produced by the energy filter is adjusted to minimize the value of electrical current of said electron beam absorbed into said slit plate.

7. The method of adjusting an electron microscope as set forth in claim 6, wherein said electron beam that has passed through said energy-selecting slit is made to impinge on a sample.

8. The method of adjusting an electron microscope as set forth in claim 7, wherein said electron beam that has passed through said energy-selecting slit enters an acceleration tube, and wherein during said step of adjusting the intensity of the deflecting field produced by said energy filter, the value of electrical current of the electron beam absorbed into said slit plate is measured by an ammeter connected between the slit plate and a point at an accelerating potential.

9. The method of adjusting an electron microscope as set forth in claim 7, wherein said electron beam is accelerated by an acceleration tube and enters said energy filter, and wherein during said step of adjusting the intensity of the deflecting field produced by said energy filter, the value of electrical current of the electron beam absorbed into said slit plate is measured by an ammeter connected between the slit plate and a point at ground potential.

10. The method of adjusting an electron microscope as set forth in claim 6, wherein said electron beam emitted from said electron beam source is transmitted through a sample and monochromatized by both said energy filter and said slit plate.

\* \* \* \* \*